US009977478B1

(12) United States Patent
Morning-Smith et al.

(10) Patent No.: US 9,977,478 B1
(45) Date of Patent: May 22, 2018

(54) MEMORY DEVICE AND METHOD WITH BACKUP ENERGY RESERVOIR TO WRITE IN-FLIGHT DATA IN NON-VOLATILE MEMORY (71) Applicant: INTEL CORPORATION, Santa Clara, CA (US)

(72) Inventors: Andrew Morning-Smith, Vancouver (CA); Adrian Mocanu, Langley (CA); Zeljko Zupanc, Vancouver (CA)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/391,037

(22) Filed: Dec. 27, 2016

(51) Int. Cl.
G11C 5/14 (2006.01)
G06F 13/00 (2006.01)
G06F 1/30 (2006.01)
G06F 1/28 (2006.01)

(52) U.S. Cl.
CPC .................. G06F 1/30 (2013.01); G06F 1/28 (2013.01); G11C 5/148 (2013.01)

(58) Field of Classification Search
None
See application file for complete search history.

(56) References Cited

U.S. PATENT DOCUMENTS 5,254,928 A * 10/1993 Young .................. H02J 7/0004
307/66
6,269,434 B1 * 7/2001 Tanaka ..................... G11C 7/16
707/999.202
6,523,128 B1 * 2/2003 Stapleton ............... G06F 1/3203
713/324
2007/0176752 A1 * 8/2007 Mickle ............... G06K 19/0723
340/10.33
2008/0062802 A1 * 3/2008 Lin .......................... G11C 5/14
365/227
2010/0229018 A1 9/2010 Hutchison et al.
2013/0097458 A1 4/2013 Sekino et al.
2015/0153802 A1 6/2015 Lucas et al.
2016/0043705 A1 * 2/2016 Tang ...................... H03K 3/012
327/63
2016/0246345 A1 8/2016 Johnston
2016/0349817 A1 12/2016 Kumar et al.

OTHER PUBLICATIONS

International Search Report and Written Opinion, dated Mar. 5, 2018, for International Application No. PCT/US2017/063531, Total 12 pp.

* cited by examiner

Primary Examiner — Son Dinh
Assistant Examiner — Sultana Begum
(74) Attorney, Agent, or Firm — Konrad Raynes Davda & Victor LLP; Rabindranath Dutta (57) ABSTRACT Provided is a memory device, comprising a non-volatile memory, an energy store coupled to the non-volatile memory, and a power management module configurable to power up the non-volatile memory and provide read access to the non-volatile memory, in response to the energy store being charged to at least a first predetermined level. Provided also is a computational device that includes the memory device. Provided also is a method in which an energy store coupled to a non-volatile memory of a memory device is charged to at least a first predetermined level. The non-volatile memory is powered up and read access is provided to the non-volatile memory, in response to charging the energy store to at least the first predetermined level.

22 Claims, 6 Drawing Sheets

MEMORY DEVICE AND METHOD WITH BACKUP ENERGY RESERVOIR TO WRITE IN-FLIGHT DATA IN NON-VOLATILE MEMORY

BACKGROUND

A solid state drive (SSD) is a data storage device that uses integrated circuit assemblies as non-volatile memory to store data persistently. The SSD may be coupled to a host computing system, such as a personal computer or a server, where the host computing system performs input/output (I/O) operations on the SSD, and where the I/O operations may include writing data to the SSD and reading data from the SSD.

The host computing system provides power to the SSD, and the SSD may undergo a power failure because the host computing system may have failed to provide power to the SSD. In the event of a power failure in the SSD, a backup energy reservoir, such as a capacitor, may allow the SSD to save in-flight data by storing the in-flight data persistently in the non-volatile memory of the SSD, prior to the complete shutdown of the SSD, where the in-flight data may include writes that have not been committed to the non-volatile memory of the SSD at the time of power failure in the SSD.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Figure 1:
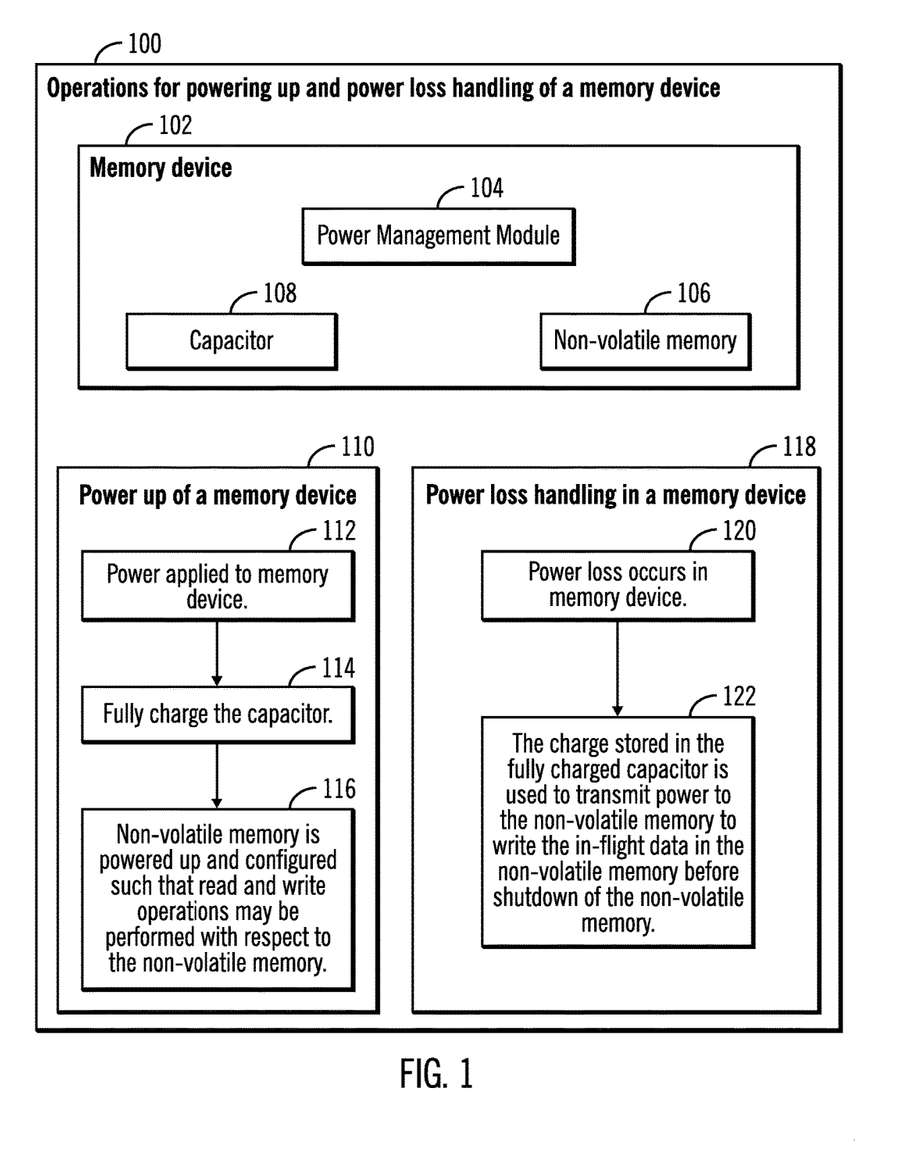
FIG. 1 illustrates a diagram that shows operations for powering up and power loss handling of a memory device.

FIG. 1 illustrates a diagram 100 that shows operations for powering up and power loss handling of a memory device. A memory device 102 may be comprised of a power management module 104 that controls the powering up of the memory device 102 and also handles a power loss event in the memory device 102. In the event of a loss of power to the memory device 102, the power management module 104 may supply power to the non-volatile memory 106 from the charge stored in the capacitor 108.

During the powering up of the memory device (as shown via reference numeral 110), power is applied (at block 112) to the memory device 102, and the capacitor 108 gets full charged (at block 114). Once the capacitor 108 is fully charged, the non-volatile memory 106 is powered up and configured, such that read and write operations may be performed on the non-volatile memory 106 (at block 116).

During the power loss handling in the memory device (as shown via reference numeral 118), in response to determining that a power loss has occurred (at block 120) in the memory device 102, the charge stored in the fully charged capacitor 108 is used to transmit power to the non-volatile memory 106 to write the in-flight data in the non-volatile memory 106 before shutdown of the non-volatile memory 106 (at block 122). "In-flight data" refers to writes sent to the memory device 102 from a host computing system, where the writes have not yet been committed to the non-volatile memory 106 of the memory device 102. "In-flight data" also refers to any write that is in progress and as a result is not yet complete. Additionally, "in-flight data" may also refer to data that has been temporarily buffered or cached in volatile memory, acknowledged as written back to a host computing system, but not yet committed to the non-volatile memory 106 of the memory device 102. "In-flight data" may also include data management structures that are stored in volatile memory of the memory device 102. "In-flight data" may also be referred to as "data in flight" or "writes in flight".

The operation of fully charging the capacitor 108 during the powering up of the memory device 102 takes a considerable amount of time and during this time the non-volatile memory 106 cannot be used. Certain embodiments described in FIGS. 2-6 provide mechanisms to use the non-volatile memory 106 of the memory device 102 without fully charging the capacitor 108, while at the same time performing power loss handling in the memory device 102. Such embodiments allow the non-volatile memory 106 of the memory device 102 to be used much earlier during power up of the memory device 102.

Figure 2:
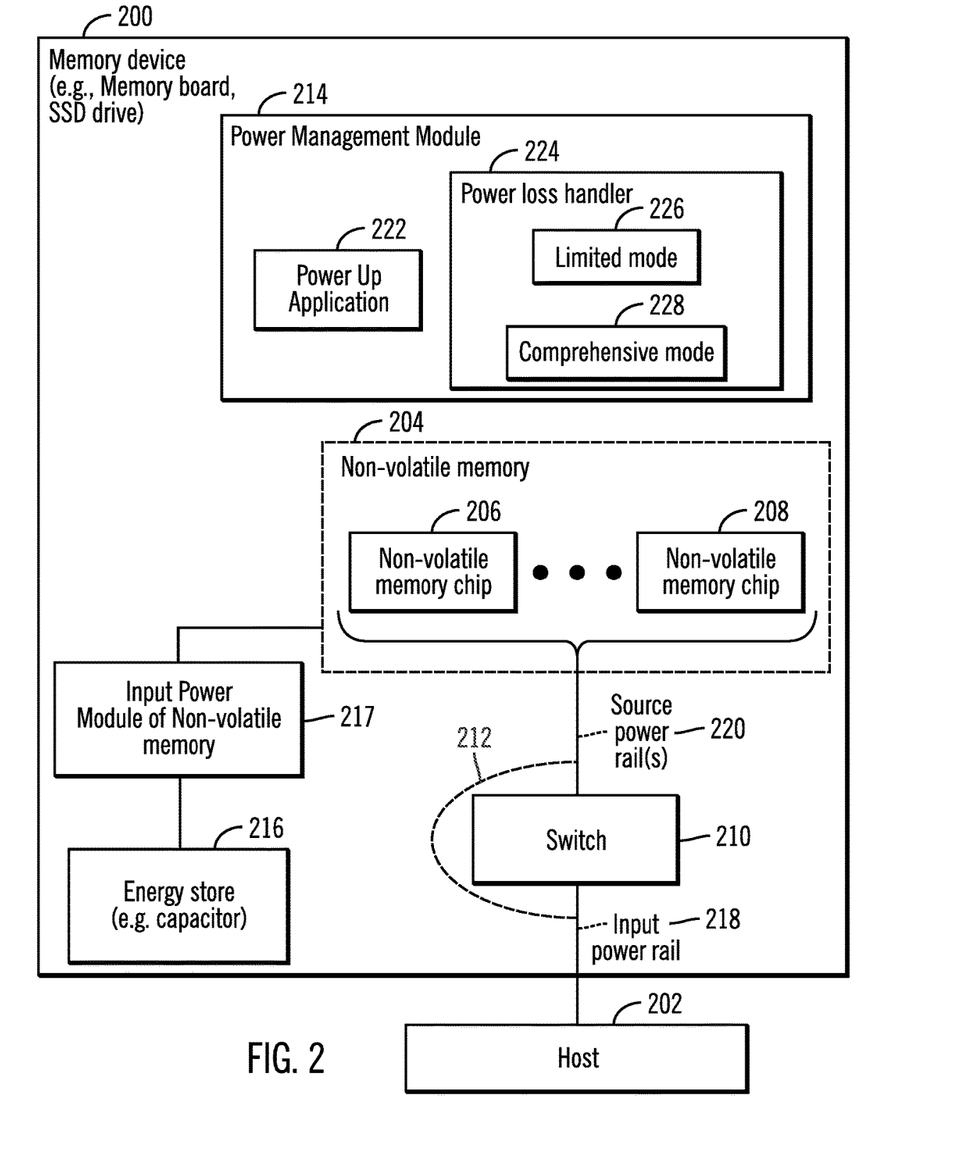
FIG. 2 illustrates a block diagram that shows a memory device in which the functions of the memory device are enabled in a plurality of phases, in accordance with certain embodiments.

FIG. 2 illustrates a block diagram that shows a memory device 200 coupled to a host 202, in which the functions of the memory device 200 are enabled in a plurality of phases, in accordance with certain embodiments. The memory device 200 may comprise a memory board, a SSD, or any other device that includes non-volatile memory 204. In certain embodiments, the non-volatile memory 204 may be comprised of one or more non-volatile memory chips 206, 208. Other configurations of the memory device 200 are possible in alternative embodiments, as long as the memory device 200 includes non-volatile memory 204 whose in-flight data needs to be preserved if there is any in-flight data, in the event of a loss of power provided by the host 202 or some other device.

Although various embodiments are described with respect to SSD, embodiments may be applied to any memory device that comprise non-volatile memory. In one embodiment, the memory device is a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, a spintronic magnetic junction memory based device, or a combination of any of the above, or other memory. The memory device may refer to the die itself and/or to a packaged memory product.

In certain embodiments, the host 202 may be a computational device (e.g., a laptop computer, a desktop computer, a tablet, a cell phone, a processor, a server, a disk array, or any other suitable computational device), and the memory device 200 may be included inside or may be located outside the host 202.

The memory device 200 includes a switch 210 that is positioned in a power line 212 that supplies power to the memory device 200 from the host 202. The power line 212 is comprised of an input power rail 218 that transmits power from the host 202 to the switch 210 and one or more source power rails 220 that transmit power from the switch 210 to the non-volatile memory 204. There may be a single instance of an input power rail 218, a power line 212, and a source power rail 220, or there may be one or more instances of input power rails, power lines, and source power rails (e.g., in certain embodiments a plurality of input power rails may feed a plurality of source power rails). In certain embodiments in which the plurality of non-volatile memory chips 206, 208 of the non-volatile memory 204 use different voltages, the plurality of source power rails 220 may provide the different voltages.

If power is lost from the host 202, then a power management module 214 of the memory device 200 may use an energy store 216 (e.g., a capacitor that stores charge) included in the memory device 200 to supply backup power to the non-volatile memory 204, so that any in-flight data that is present is written via a controlled shutdown of the memory device 200. The energy store 216 is coupled to the non-volatile memory 204 via an input power module 217 of the non-volatile memory 204. The power management module 214 may be implemented in hardware, firmware, software or any combination thereof. The power management module 214 may include a power up application 222 and a power loss handler 224. The power up application 222 manages the powering up of the memory device 200 after power is restored to the memory device 200 from the host 202 via the input power rail 218. The power loss handler 224 handles the situation in which power supply to the memory device 200 is not provided by the host 202 via the input power rail 218, and charge stored in the energy store 216 has to be used to at least shut down the one or more source power rails 220 of the non-volatile memory 204, and supply enough power to the non-volatile memory 204 and other components to write in-flight data in the non-volatile memory 204 if such in-flight data is present in the memory device 200.

The power loss handler 224 may operate in either a limited mode 226 or in a comprehensive mode 228. In the limited mode 226, the power loss handler 224 uses a relatively small amount of charge (in comparison to the charge used in the comprehensive mode 228) from the energy store 216 to shut down the one or more source power rails 220 and there is no need to write in-flight data in the non-volatile memory 204 as in-flight data is not present. In the comprehensive mode 228, the power loss handler 224 uses a relatively large amount of charge (in comparison to the charge used in the limited mode 226) from the energy store 216 to write the in-flight data in the non-volatile memory 204 and also to shut down the one or more source power rails 220 to the non-volatile memory 204.

Figure 3:
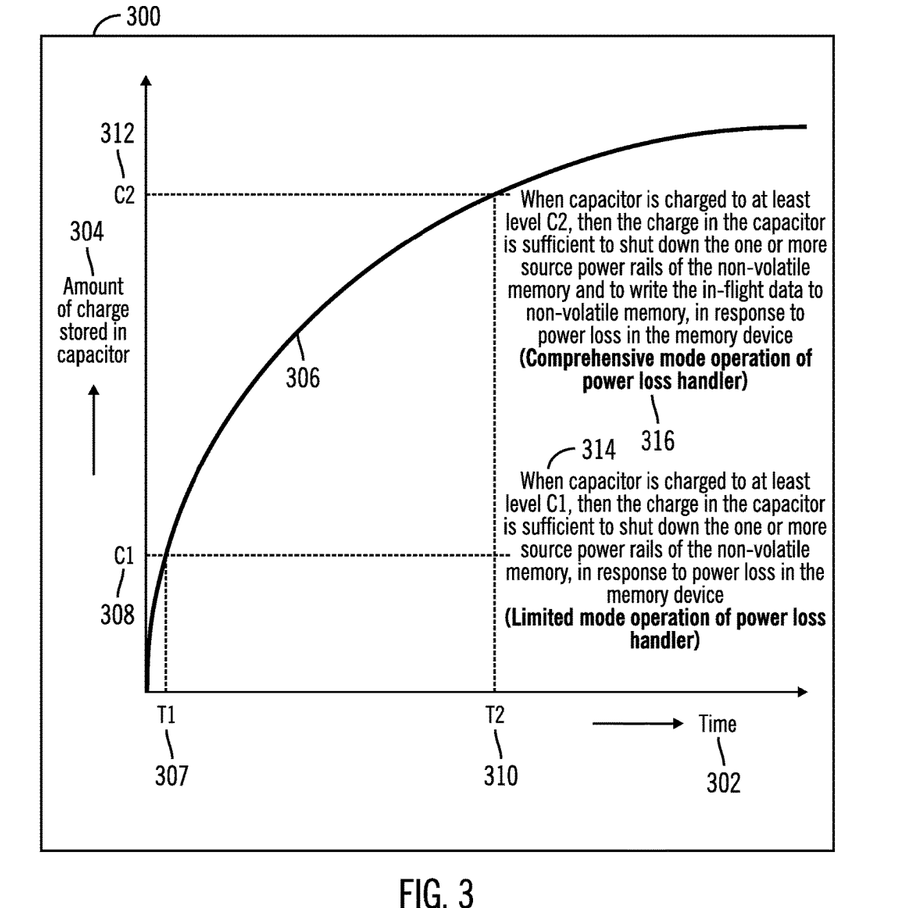
FIG. 3 illustrates a block diagram that shows various modes of operation of a power loss handler, in accordance with certain embodiments.

FIG. 3 illustrates a diagram 300 that shows various modes of operation of the power loss handler 224, in accordance with certain embodiments. The horizontal axis shows a duration of time 302 starting from a restoration of power to the memory device 200 from the host 202 via the input power rail 218. The vertical axis shows the amount of charge 304 stored in the capacitor 216 or some other energy store.

The curve shown via reference numeral 306 indicates the charge stored in the capacitor 216 at different times. Initially no charge is stored in the capacitor 216 when power is restored to the memory device 200 via the input power rail 218 from the host 202, and at time T1 307 the capacitor 216 has an amount of charge denoted by C1 308, and at a later point in time T2 310 the capacitor 216 has an amount of charge denoted by C2 312. In certain embodiments C1 308 is 10% or less of the total charge capacity of the capacitor 216, and C2 312 is 70% of more of the total charge capacity of the capacitor 216.

FIG. 3 shows (via reference numeral 314) that when the capacitor 216 is charged to at least level C1, then the charge in the capacitor 216 is sufficient to shut down the one or more source power rails 220 of the non-volatile memory 204, in response to a power loss in the memory device 200. In such a situation, the power loss handler 224 may function in the limited mode 226 but not in the comprehensive mode 228.

FIG. 3 also shows (via reference numeral 316) that when the capacitor 216 is charged to at least level C2 312 (which is substantially higher than the C1 level), then the charge in the capacitor 216 is sufficient to shut down the one or more source power rails 220 of the non-volatile memory 204 and also to write the in-flight data to the non-volatile memory 204, in response to a power loss in the memory device 200. In such a situation, the power loss handler 224 may function in the comprehensive mode 228.

Therefore, FIG. 3 shows that at a first predetermined level of charge C1 308, the power loss handler 224 may function in the limited mode 226 but not in the comprehensive mode 228. At a higher second predetermined level of charge C2 312 the power loss handler 224 may function in the comprehensive mode 228. In the comprehensive mode 228, the power loss handler 224 is able to write in-flight data to the non-volatile memory 204.

Figure 4:
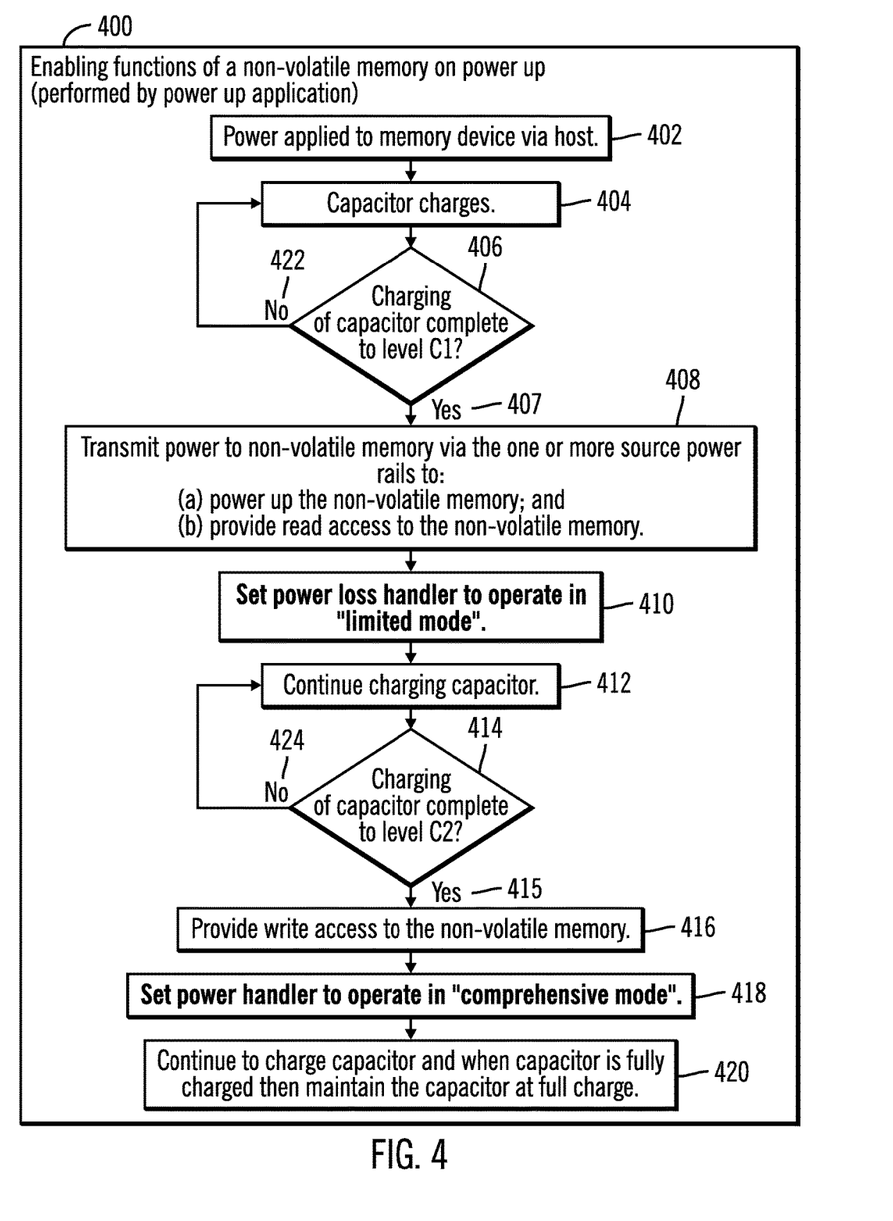
FIG. 4 illustrates a flowchart the shows how functions of a memory device are enabled in a plurality of phases, in accordance with certain embodiments.

FIG. 4 illustrates a flowchart 400 that shows how functions of a memory device 200 are enabled in a plurality of phases during power up of the memory device 200, in accordance with certain embodiments. The operations shown in FIG. 4 may be performed by the power management module 214 in combination with other modules that execute in the memory device 200.

Control starts at block 402 in which power is applied to a memory device 200 by a host 202. Control proceeds to block 404 in which the capacitor 216 starts charging. The power up application 222 determines (at block 406) whether the charging of the capacitor 216 is complete to level C1 308. If so ("Yes" branch 407), the power up application 222 ensures (at block 408) that power is transmitted to the non-volatile memory 204 via the one or more source power rails 220 to power up the non-volatile memory 204 and provide read access to the non-volatile memory 204. Control proceeds to block 410 in which the power up application 222 sets the power loss handler 224 to operate in the limited mode 226. Since only a relatively small amount of charge is stored in the capacitor 216 at charge level C1 308 (which is the charge level of the capacitor 216 at block 410), the power loss handler 224 is set to the limited mode 226 in which no in-flight data is written to the non-volatile memory 204 during a power failure. Since the non-volatile memory 204 has still not been configured for writes there is no in-flight data and the limited mode 226 is adequate for the power loss handler 224.

The capacitor 216 continues to be charged (at block 412) and control proceeds to block 414 in which the power up application 222 determines whether the charging of the capacitor 216 is complete to level C2 312. If so ("Yes" branch 415) the power up application 222 ensures (at block 416) that the non-volatile memory 204 is configured for write access (in addition to the read access for which the non-volatile memory 204 has already been configured in block 408). As a result, if there is a power failure after block 416 there may be in-flight data that has to be written in the non-volatile memory 204, and at block 418 the power up application 222 sets the power loss handler 224 to operate in the comprehensive mode 228 in which in-flight data is written to the non-volatile memory 204. The capacitor 216 may continue to get charged (at block 420) and once the capacitor 216 is fully charged (unless level C2 is a fully charged condition for the capacitor 216) then the capacitor 216 is maintained at full charge.

From block 406 if the capacitor 216 has not charged to level C1 ("No" branch 422) control returns to block 404 for additional charging of the capacitor 216. From block 414, if the capacitor 216 has not charged to level C2 ("No" branch 424) control returns to block 412 for additional charging of the capacitor 216.

Therefore, FIG. 4 illustrates that in a first phase, after the capacitor 216 has been charged to a relatively low level C1 308, only read operations are allowed on the non-volatile memory 204 and the power loss handler 224 is set to operate in the limited mode 226. Only when the capacitor 216 is charged to a sufficiently high enough level (e.g., level C2 312) in which the power loss handler 224 can operate in the comprehensive mode 228 to write in-flight data to the non-volatile memory 204, are write operations on the non-volatile memory 204 permitted.

Therefore, at an early instant of time T1 307, the non-volatile memory 204 is functional for read operations, and at a later instant of time T2 310 the non-volatile memory 204 is functional for both read and write operations. This is an improvement over the system shown in FIG. 1, in which only when the capacitor 108 is fully charged are read and write operations allowed on the non-volatile memory 106, and this may not only take a time longer than T1 307 but may take a time longer than T2 310. Read operations from the memory device 200 are allowed earlier, in embodiments shown in FIGS. 2-4 in comparison to the operations shown in FIG. 1.

Figure 5:
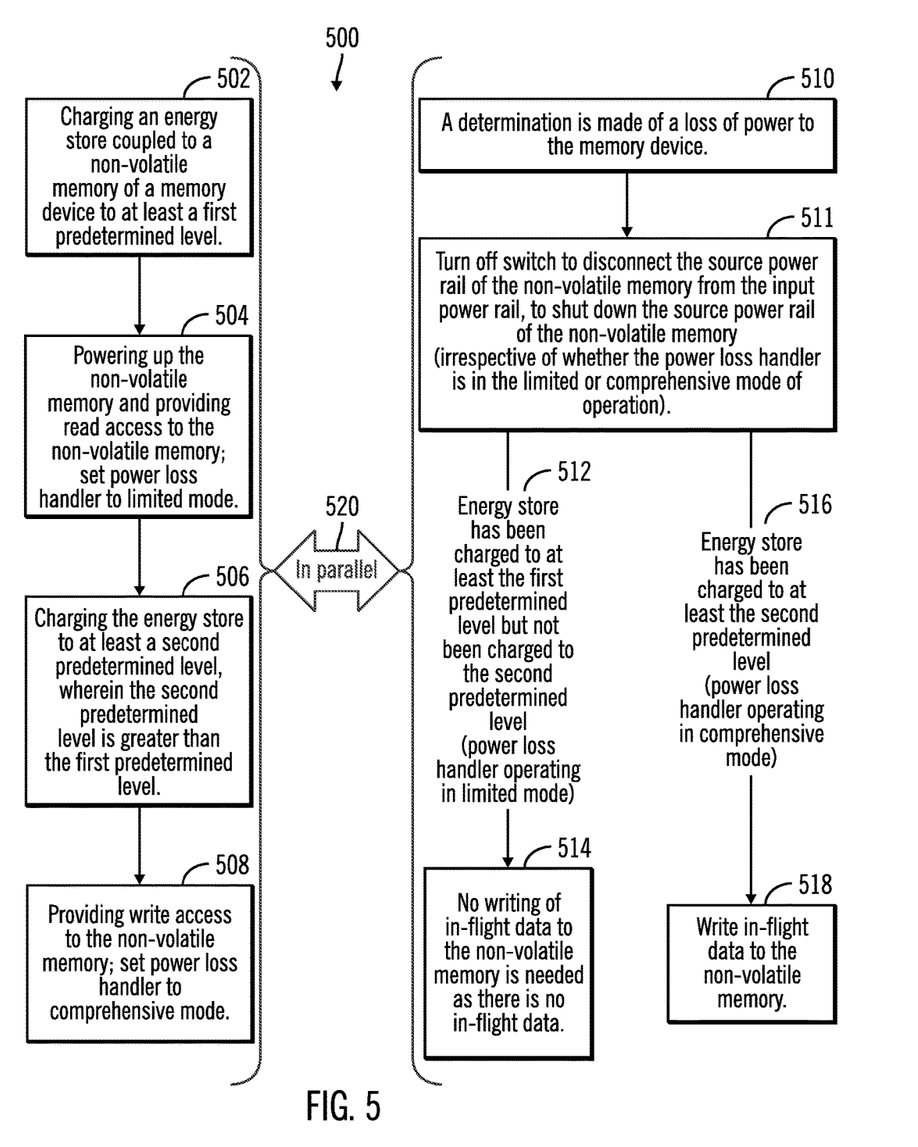
FIG. 5 illustrates a flowchart that shows how functions of a memory device are enabled in a plurality of phases, and various modes of operation of a power loss handler, in accordance with certain embodiments.

FIG. 5 illustrates a flowchart 500 that shows how functions of a memory device 200 are enabled in a plurality of phases, and various modes of operation of a power loss handler 224, in accordance with certain embodiments. The operations shown in FIG. 5 may be performed by the power management module 214 in combination with other modules that execute in the memory device 200.

Control starts at block 502 in which an energy store 216 coupled to a non-volatile memory 204 of a memory device 200 is charged to at least a first predetermined level C1 308. Control proceeds to block 504 in which the non-volatile memory 204 is powered up and read access is provided to the non-volatile memory 204, in response to charging the energy store 216 to at least the first predetermined level C1 308. At block 504, the power loss handler 224 is set to the limited mode 226.

From block 504, control proceeds to block 506 in which the energy store 216 is charged to at least a second predetermined level C2 312, where the second predetermined level C2 312 is greater than the first predetermined level C1 308. Write access is provided (at block 508) to the non-volatile memory 204, in response to charging the energy store 216 to at least the second predetermined level C2 312. At block 508, the power loss handler 224 is set to the comprehensive mode 228.

While operations shown in blocks 502, 504, 506, 508 are being performed by the power up application 222 of the power management module 214, the operations shown in blocks 510, 512, 514, 516, 518 may be performed in parallel (shown via reference numeral 520) by the power loss handler 224 of the power management module 214.

At block 510, a determination is made by the power loss handler 224 of a loss of power to the memory device 200. Irrespective of whether the power loss handler 224 is operating in the limited mode 226 or in the comprehensive mode 228, the power loss handler 224 performs operations (at block 511) to turn off the switch 210 to disconnect the source power rail 220 of the non-volatile memory 204 from the input power rail 218, to shut down the source power rail 220 of the non-volatile memory 204. In certain embodiments, if there are two or more source power rails 220 (i.e., there is more than one source power rail), then the two or more source power rails 220 are shut down in a sequence that is referred to as a shutdown sequence. For example, if there are two source power rails comprising a first source power rail and a second source power rail, then in a shutdown sequence, the first source power rail is shut down and then the second source power rail is shut down.

If the energy store 216 has been charged to at least the first predetermined level C1 308 but has not been charged to the second predetermined level C2 312 (shown via reference numeral 512 in which the power loss handler 224 is operating in the limited mode 226), then no writing of in-flight data to the non-volatile memory 204 is needed as there is no in-flight data (at block 514). If the energy store 216 has been charged to at least the second predetermined level C2 312 (shown via reference numeral 516 in which the power loss handler 224 is operating in the comprehensive mode 228) then in-flight data is written to the non-volatile memory 204 (at block 518).

It should be noted that the energy store 216 is partially charged when the energy store 216 has been charged to the first predetermined level C1 308, and the energy store 216 is partially or fully charged when the energy store 216 has been charged to the second predetermined level C2 312.

Therefore, FIGS. 1-5 illustrate certain embodiments in which an energy store 216 of a memory device 200 is charged in two phases. In the first phase, after the energy store 216 has been charged to a relatively low level C1 308, only read operations are allowed on the non-volatile memory 204 and the power loss handler 224 is set to operate in the limited mode 226. In the limited mode 226 there is no need to write any in-flight data to the non-volatile memory 204, as only read operations are allowed and there is no in-flight data. Only when the energy store 216 is charged to a sufficiently high enough level (e.g., level C2 312), is the power loss handler 224 set to operate in the comprehensive mode 228. In the comprehensive mode 228, the power loss handler 224 writes any in-flight data to the non-volatile memory 204 with the charge stored in the energy store 216, as write operations on the non-volatile memory 204 are permitted and these write operations may generate in-flight data.

The described components and/or operations may be implemented as a method, apparatus or computer program product using standard programming and/or engineering techniques to produce software, firmware, hardware, or any combination thereof. The described operations may be implemented as code maintained in a "computer readable storage medium" for implementation in certain embodiments or for software simulation of a memory chip for design purposes, where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard drive drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of flowcharts and/or block diagrams may be implemented by computer program instructions.

Figure 6:
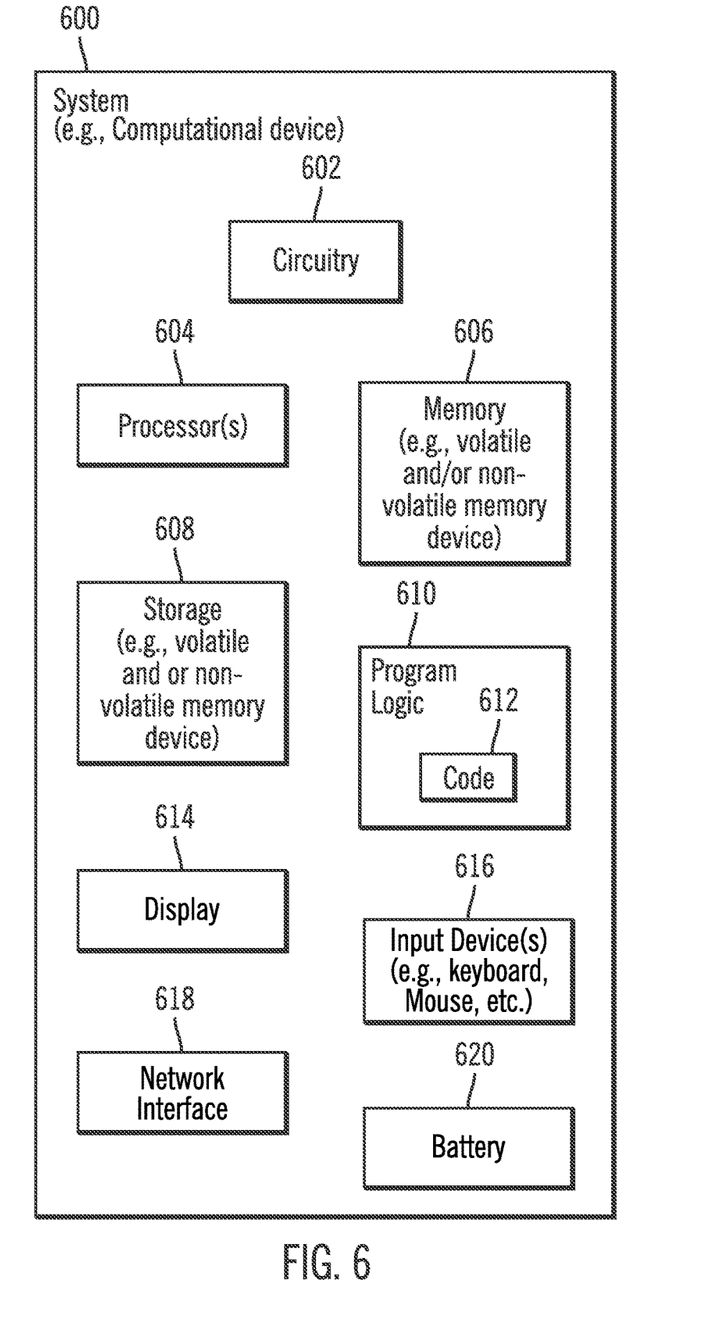
FIG. 6 illustrates a block diagram of a system including a computational device that includes a memory device comprised of non-volatile memory, in accordance with certain embodiments.

FIG. 6 illustrates a block diagram of a system 600 that may include a computational device where a memory device (designed as per the architecture of the memory device 200 shown in FIGS. 2-5) is included in the computational device. For example, in certain embodiments the system 600 may be a computer (e.g., a laptop computer, a desktop computer, a tablet, a cell phone or any other suitable computational device) that has a memory device (designed as per the architecture of memory device 200 shown in FIGS. 2-5) in the computer. The system 600 may include a circuitry 602 that may in certain embodiments include at least a processor 604. The system 600 may also include a memory 606 (e.g., a memory device 200 as per the architecture shown in FIGS. 2-5), and storage 608 (e.g., a memory device 200 as per the architecture shown in FIGS. 2-5). The storage 608 may include a solid state drive, a disk drive, or other drives or devices including a non-volatile memory device (e.g., EEPROM, ROM, PROM, flash, firmware, programmable logic, etc.). The storage 608 may also include a magnetic disk drive, an optical disk drive, a tape drive, etc. The storage 608 may comprise an internal storage device, an attached storage device and/or a network accessible storage device. The system 600 may include a program logic 610 including code 612 that may be loaded into the memory 606 and executed by the processor 604 or circuitry 602. In certain embodiments, the program logic 610 including code 612 may be stored in the storage 608. In certain other embodiments, the program logic 610 may be implemented in the circuitry 602. Therefore, while FIG. 6 shows the program logic 610 separately from the other elements, the program logic 610 may be implemented in the memory 606 and/or the circuitry 602. The system 600 may also include a display 614 (e.g., an liquid crystal display (LCD), a light emitting diode (LED) display, a cathode ray tube (CRT) display, a touchscreen display, or any other suitable display). The system 600 may also include one or more input devices 616, such as, a keyboard, a mouse, a joystick, a trackpad, or any other suitable input devices. In certain embodiments, the display 614 may be coupled to a memory device comprising the storage 608 and/or the memory 606; a network interface 618 may be communicatively coupled to the processor 604; and a battery 620 may be communicatively coupled to the processor 604. Other components or devices beyond those shown in FIG. 6 may also be found in the system 600.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments.

Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a memory device for data storage, the memory device comprising: a non-volatile memory; an energy store coupled to the non-volatile memory; and a power management module configurable to power up the non-volatile memory and provide read access to the non-volatile memory, in response to the energy store being charged to at least a first predetermined level.

In example 2, the subject matter of example 1 may include that the energy store is partially charged when the energy store has been charged to the first predetermined level.

In example 3, the subject matter of example 1 may include that the power management module is further configurable to provide write access to the non-volatile memory, in response to the energy store being charged to at least a second predetermined level.

In example 4, the subject matter of example 3 may include that the second predetermined level is greater than the first predetermined level.

In example 5, the subject matter of example 4 may include that the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

In example 6, the subject matter of example 4 may include that the power management module is further configurable to shut down one or more source power rails of the non-volatile memory, and write in-flight data to the non-volatile memory, in response to a loss of power to the memory device while the energy store been charged to at least the second predetermined level, wherein if there are two or more source power rails then a shutdown sequence is used to shut down the two or more source power rails.

In example 7, the subject matter of example 4 may include that the energy store is partially or fully charged when the energy store has been charged to the second predetermined level.

Example 8 is a method for data storage in which an energy store coupled to a non-volatile memory of a memory device is charged to at least a first predetermined level. The non-volatile memory is powered up and read access to the non-volatile memory is provided, in response to charging the energy store to at least the first predetermined level.

In example 9, the subject matter of example 8 may include that the energy store is partially charged when the energy store has been charged to the first predetermined level.

In example 10, the subject matter of example 8 may include that write access to the non-volatile memory is provided, in response to charging the energy store to at least a second predetermined level.

In example 11, the subject matter of example 10 may include that the second predetermined level is greater than the first predetermined level.

In example 12, the subject matter of example 11 may include shutting down one or more source power rails of the non-volatile memory, in response to a loss of power to the memory device while the energy store has been charged to at least the first predetermined level but not been charged to the second predetermined level, wherein if there are two or more source power rails then a shutdown sequence is used to shut down the two or more source power rails.

In example 13, the subject matter of example 11 may include shutting down one or more source power rails of the non-volatile memory and writing in-flight data to the non-volatile memory, in response to a loss of power to the memory device while the energy store been charged to at least the second predetermined level, wherein if there are two or more source power rails then a shutdown sequence is used to shut down the two or more source power rails.

In example 14, the subject matter of example 10 may include that the energy store is partially or fully charged when the energy store has been charged to the second predetermined level.

Example 15 is a computational device for data storage, the computational device comprising: a processor; and a memory device coupled to the processor, the memory device comprising: a non-volatile memory; an energy store coupled to the non-volatile memory; and a power management module configurable to power up the non-volatile memory and provide read access to the non-volatile memory, in response to the energy store being charged to at least a first predetermined level.

In example 16, the subject matter of example 15 may include that the energy store is partially charged when the energy store has been charged to the first predetermined level.

In example 17, the subject matter of example 15 may include that the power management module is further configurable to provide write access to the non-volatile memory, in response to the energy store being charged to at least a second predetermined level.

In example 18, the subject matter of example 17 may include that the second predetermined level is greater than the first predetermined level.

In example 19, the subject matter of example 18 may include that the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

In example 20, the subject matter of example 18 may include that the power management module is further configurable to shut down one or more source power rails of the non-volatile memory and write in-flight data to the non-volatile memory, in response to a loss of power to the memory device while the energy store been charged to at least the second predetermined level, and wherein if there are two or more source power rails then a shutdown sequence is used to shut down the two or more source power rails.

In example 21, the subject matter of example 17 may include that the energy store is partially or fully charged when the energy store has been charged to the second predetermined level.

Example 22 is a computational device for data storage, the computational device comprising: a processor; a display communicatively coupled to the processor; a network interface communicatively coupled to the processor; and a memory device coupled to the processor, the memory device comprising: a non-volatile memory; an energy store coupled to the non-volatile memory; and a power management module configurable to power up the non-volatile memory and provide read access to the non-volatile memory, in response to the energy store being charged to at least a first predetermined level.

In example 23, the subject matter of example 22 may include that the power management module is further configurable to provide write access to the non-volatile memory, in response to the energy store being charged to at least a second predetermined level.

In example 24, the subject matter of example 23 may include that the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

In example 25, the subject matter of example 23 may include that the power management module is further configurable to shut down one or more source power rails of the non-volatile memory and write in-flight data to the non-volatile memory, in response to a loss of power to the memory device while the energy store been charged to at least the second predetermined level, and wherein if there are two or more source power rails then a shutdown sequence is used to shut down the two or more source power rails.

Example 26 is a system for data storage, the system comprising: means for charging an energy store coupled to a non-volatile memory of a memory device to at least a first predetermined level; and means for powering up the non-volatile memory and providing read access to the non-volatile memory, in response to charging the energy store to at least the first predetermined level.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:

1. A memory device, comprising:
   a non-volatile memory;
   an energy store coupled to the non-volatile memory; and
   a power management module configurable to provide read access to the non-volatile memory in response to the energy store being charged to an amount that is at least of a first predetermined level, and to provide write access to the non-volatile memory in response to the energy store being charged to an amount that is at least of a second predetermined level that is greater than the first predetermined level.

2. The memory device of claim 1, wherein the energy store is partially charged when the energy store has been charged to the first predetermined level.

3. The memory device of claim 1, wherein the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

4. The memory device of claim 1, wherein the power management module is further configurable to shut down one or more source power rails of the non-volatile memory, and write in-flight data to the non-volatile memory, in response to a loss of power to the memory device while the energy store been charged to at least the second predetermined level, and wherein if there are two or more source power rails then a shutdown sequence is used to shut down the two or more source power rails.

5. The memory device of claim 1, wherein the energy store is partially or fully charged when the energy store has been charged to the second predetermined level.

6. The memory device of claim 1, wherein the energy store comprises a capacitor.

7. A method, comprising:
   charging an energy store coupled to a non-volatile memory of a memory device to an amount that is at least of a first predetermined level;
   providing read access to the non-volatile memory in response to charging the energy store to the amount that is at least of the first predetermined level; and
   providing write access to the non-volatile memory in response to charging the energy store to an amount that is at least of a second predetermined level that is greater than the first predetermined level.

8. The method of claim 7, wherein the energy store is partially charged when the energy store has been charged to the first predetermined level.

9. The method of claim 7, the method further comprising:
   shutting down one or more source power rails of the non-volatile memory, in response to a loss of power to the memory device while the energy store has been charged to at least the first predetermined level but not been charged to the second predetermined level, wherein if there are two or more source power rails then a shutdown sequence is used to shut down the two or more source power rails.

10. The method of claim 7, the method further comprising:
    shutting down one or more source power rails of the non-volatile memory and writing in-flight data to the non-volatile memory, in response to a loss of power to the memory device while the energy store been charged to at least the second predetermined level, wherein if there are two or more source power rails then a shutdown sequence is used to shut down the two or more source power rails.

11. The method of claim 7, wherein the energy store is partially or fully charged when the energy store has been charged to the second predetermined level.

12. The method of claim 7, wherein the energy store comprises a capacitor.

13. A computational device, comprising:
a processor; and
a memory device coupled to the processor, the memory device comprising:
  a non-volatile memory;
  an energy store coupled to the non-volatile memory; and
  a power management module configurable to provide read access to the non-volatile memory in response to the energy store being charged to an amount that is at least of a first predetermined level, and to provide write access to the non-volatile memory in response to the energy store being charged to an amount that is at least of a second predetermined level that is greater than the first predetermined level.

14. The computational device of claim 13, wherein the energy store is partially charged when the energy store has been charged to the first predetermined level.

15. The computational device of claim 13, wherein the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

16. The computational device of claim 13, wherein the power management module is further configurable to shut down one or more source power rails of the non-volatile memory and write in-flight data to the non-volatile memory, in response to a loss of power to the memory device while the energy store been charged to at least the second predetermined level, and wherein if there are two or more source power rails then a shutdown sequence is used to shut down the two or more source power rails.

17. The computational device of claim 13, wherein the energy store is partially or fully charged when the energy store has been charged to the second predetermined level.

18. The computational device of claim 13, wherein the energy store comprises a capacitor.

19. A computational device, comprising:
a processor;
a display communicatively coupled to the processor;
a network interface communicatively coupled to the processor; and
a memory device coupled to the processor, the memory device comprising:
  a non-volatile memory;
  an energy store coupled to the non-volatile memory; and
  a power management module configurable to provide read access to the non-volatile memory in response to the energy store being charged to an amount that is at least of a first predetermined level, and to provide write access to the non-volatile memory in response to the energy store being charged to an amount that is at least of a second predetermined level that is greater than the first predetermined level.

20. The computational device of claim 19, wherein the power management module is further configurable to shut down one or more source power rails of the non-volatile memory, in response to a loss of power to the memory device while the energy store has been charged to at least the first predetermined level but not been charged to the second predetermined level, and wherein if there are two or more source power rails then a shutdown sequence is used to shut down the two or more source power rails.

21. The computational device of claim 19, wherein the power management module is further configurable to shut down one or more source power rails of the non-volatile memory and write in-flight data to the non-volatile memory, in response to a loss of power to the memory device while the energy store been charged to at least the second predetermined level, and wherein if there are two or more source power rails then a shutdown sequence is used to shut down the two or more source power rails.

22. The computational device of claim 19, wherein the energy store comprises a capacitor.

* * * * *